United States Patent
Bailey

(10) Patent No.: US 7,787,251 B2
(45) Date of Patent: Aug. 31, 2010

(54) PRINTED CIRCUIT BOARD EMPLOYING HEAT SINK RETAINING APPARATUS AND METHOD OF USE

(75) Inventor: Edmond I. Bailey, Cedar Park, TX (US)

(73) Assignee: Dell Products, LP, Round Rock, TX (US)

( * ) Notice: Subject to any disclaimer, the term of this patent is extended or adjusted under 35 U.S.C. 154(b) by 156 days.

(21) Appl. No.: 11/733,926

(22) Filed: Apr. 11, 2007

(65) Prior Publication Data

US 2008/0253093 A1 Oct. 16, 2008

(51) Int. Cl.
- *H05K 7/20* (2006.01)
- *F28F 7/00* (2006.01)
- *H01B 7/42* (2006.01)
- *H01L 23/34* (2006.01)

(52) U.S. Cl. .............. 361/719; 361/704; 361/709; 361/710; 165/80.2; 165/80.3; 165/185; 174/16.1; 174/16.3; 257/718; 257/719

(58) Field of Classification Search .............. 361/704, 361/709, 710, 718–719; 165/80.2, 80.3, 165/185; 174/16.1, 16.3; 257/718–719
See application file for complete search history.

(56) References Cited

U.S. PATENT DOCUMENTS

| | | | | |
|---|---|---|---|---|
| 5,329,426 A | * | 7/1994 | Villani | 361/719 |
| 6,130,821 A | * | 10/2000 | Gerber | 361/704 |
| 6,219,236 B1 | * | 4/2001 | Hirano et al. | 361/695 |
| 6,331,937 B1 | | 12/2001 | Bartyzel | |
| 6,496,373 B1 | * | 12/2002 | Chung | 361/705 |
| 6,617,685 B1 | * | 9/2003 | Bollesen | 257/719 |
| 6,683,449 B1 | * | 1/2004 | Bell et al. | 324/158.1 |
| 7,161,808 B2 | | 1/2007 | Atkinson | |
| 2003/0070790 A1 | * | 4/2003 | Chen et al. | 165/80.3 |
| 2003/0106670 A1 | * | 6/2003 | Lee et al. | 165/80.3 |
| 2005/0079743 A1 | * | 4/2005 | Hou et al. | 439/65 |
| 2005/0099172 A1 | * | 5/2005 | Durham et al. | 324/158.1 |
| 2006/0037735 A1 | * | 2/2006 | Connors | 165/80.3 |
| 2006/0268509 A1 | | 11/2006 | Marroquin et al. | |

OTHER PUBLICATIONS

Tyco Electronics Corporation. "Heat Sink Assemblies for BGA Semiconductor Packages." 2009. <http://catalog.tycoelectronics.com/TE/bin/TE.Connect?C=16819&F=0&M=CINF&BML=10576,16358,16359&GIID=0&LG=1&I=13&RQS=C~16819^M~FEAT^BML~10576,16358,16359^G~G>.

Aavid Thermalloy, LLC. "BGS Attachment Method." 2007. <http://www.aavidthermalloy.com/cgi-bin/bga_disp.pl?partnum=036988& attach=DEVICE&size=26.10&height=15.20&length=20.50& nc=32.60&fc=9.94&pkg=All>.

* cited by examiner

*Primary Examiner*—Zachary M Pape
(74) *Attorney, Agent, or Firm*—Larson Newman & Abel, LLP

(57) ABSTRACT

A printed circuit board employing a heat sink retaining apparatus and method of use is disclosed. In one form of the disclosure, a heat sink apparatus can include a heat sink operable to be coupled to a first portion of a printed circuit board having an integrated circuit, and a retaining mechanism operably coupled along a first surface of the heat sink. The retaining mechanism can be coupled to a second portion of the printed circuit board to produce a tension between the first surface of the heat sink and the second portion of the printed circuit board.

8 Claims, 3 Drawing Sheets

PRINTED CIRCUIT BOARD EMPLOYING HEAT SINK RETAINING APPARATUS AND METHOD OF USE

FIELD OF THE DISCLOSURE

This disclosure relates generally to information handling systems, and more particularly to a printed circuit board employing a heat sink retaining apparatus and method of use.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Various information handling systems can be realized as servers that can be mounted within server racks. Servers can allow for accessing and serving information, applications, and various types of data to multiple clients via an Intranet, the Internet, or combinations thereof. The complexity and density of servers, and associated components for some enterprise data centers, can impact environmental operating conditions. For example, controlling operating temperatures of various components increases design flexibility when configuring systems and associated devices. However, some temperature control solutions impose on existing design specifications and can require systems or associated hardware components to be retooled or reconfigured. As such, what is needed is a temperature control solution that minimally impacts current hardware and design specifications.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
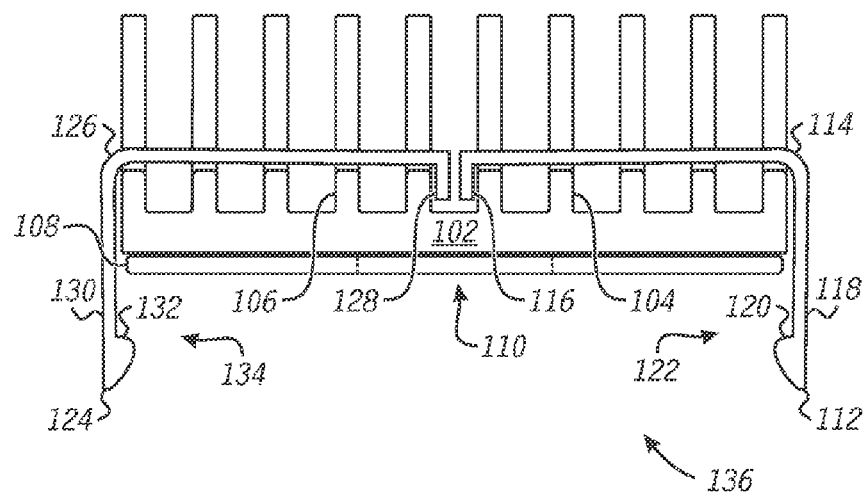
FIG. 1 illustrates a side view of heat sink apparatus incorporating a retaining mechanism according to one aspect of the disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. The teachings can also be utilized in other applications and with several different types of architectures such as distributed computing architectures, client/server architectures, or middleware server architectures and associated components.

For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device and can vary in size, shape, performance, functionality, and price. The information handling system can include memory, one or more processing resources such as a central processing unit (CPU) or hardware or software control logic. Additional components of the information handling system can include one or more storage devices, one or more communications ports for communicating with external devices as well as various input and output (I/O) devices, such as a keyboard, a mouse, and a video display. The information handling system can also include one or more buses operable to transmit communications between the various hardware components.

According to one aspect of the disclosure, a heat sink apparatus can include a heat sink operable to be coupled to a first portion of a printed circuit board having an integrated circuit, and a retaining mechanism operably coupled along a first surface of the heat sink. The retaining mechanism can be coupled to a second portion of the printed circuit board to produce a tension between the first surface of the heat sink and the second portion of the printed circuit board.

According to another aspect of the disclosure, a method of using a heat sink can include locating a heat sink mounting region of a printed circuit board and aligning a heat sink to the heat sink mounting region. The method can also include securing the heat sink to the printed circuit board using a retaining mechanism. According to one aspect, the securing can include coupling a first thermal coupling element of the retaining mechanism to a first portion of a first surface of the heat sink. The method can also include coupling a first printed circuit board tab extending from the first thermal coupling element to a first surface of the printed circuit board and, coupling a second thermal coupling element of the retaining mechanism to a second portion of the first surface of the heat sink. The method can further include coupling a second printed circuit board tab extending from the second thermal coupling element to the first surface of the printed circuit board.

According to a further aspect of the disclosure, an information handling system can include a printed circuit board including at least one integrated circuit, and a heat sink coupled to a first portion of the printed circuit board and the integrated circuit. The information handling system can also include a retaining mechanism coupled along a first surface of the heat sink. In one form, the retaining mechanism can be coupled to a second portion of the printed circuit board to produce a tension between the first surface of the heat sink, and the second portion of the printed circuit board.

FIG. 1 illustrates a side view of heat sink apparatus, illustrated generally as heat sink 100, according to one aspect of the disclosure. The heat sink 100 includes a body 102, a first thermal element series 104, and a second thermal element series 106 that can be used to dissipate thermal energy produced by an integrated circuit (not illustrated). Any number of thermal elements can be used within the first thermal element series 104 and the second thermal element series 106 as desired. The heat sink 100 can also include an insulative backing material 108, and a thermally conductive region 110 operable to be coupled to an integrated circuit. In one form, the heat sink 100 can include a heat sink having part number MC 159, and manufactured by Foxconn, Aavid, and CCI.

The heat sink 100 can also include a retaining mechanism illustrated generally at 136 and including a first tension coupling element 112 having a first thermal coupling element 114 and first tab 116. The first tension coupling element 112 can also include a first extension 118 extending from the first thermal coupling element 114, to a first printed circuit board coupler tab 120. The first tension coupling element 112 also includes a first printed circuit board cavity 122 operable to receive a printed circuit board substrate (not illustrated) to secure a portion of the heat sink 100 to the printed circuit board. According to one aspect, a printed circuit board can include a printed wiring board configured to provide interconnections between electronic devices coupled or mounted to a surface. In one form, the printed circuit board can include multiple traces that route signals between devices or components, and in one form, can include one or more electronic components integrated as a part of the printed circuit board as desired.

The retaining mechanism 136 can also include a second tension coupling element 124 having a second thermal coupling element 126 and a second tab 128. The second tension coupling element 124 can also include a second extension 130 extending from the second thermal coupling element 126, to a second printed circuit board coupler tab 132. The second tension coupling element 124 also includes a second printed circuit board cavity 134 operable to receive a printed circuit board substrate (not illustrated) to secure a portion of the heat sink 100 to the printed circuit board.

In one form, the first tension coupling element 112 and the second tension coupling element 124 can be formed of a metal material such as stainless steel, copper, alloys, or any other type of material that can be used to form a retaining element. Additionally, various sizes and shapes can also be employed and in one form, each tension coupling element can be formed into a tension clip that can be installed and removed by expanding and releasing one or more surfaces of the tension coupling element as desired. In another form, the first tension coupling element 112 and the second tension coupling element 124 can be formed into a single piece of material that can include the first tension coupling element 112 and the second tension coupling element 124. According to another aspect, the retaining mechanism 136 can be used to secure the heat sink 100 without having to solder or glue portions of the heat sink, printed circuit board, or tension coupling element, or any combination thereof. As such, the heat sink 100 can be easily installed and removed as desired while consuming little or no surface area of the printed circuit board to ensure a secure mounting of the heat sink 100 to the printed circuit board.

Figure 2:
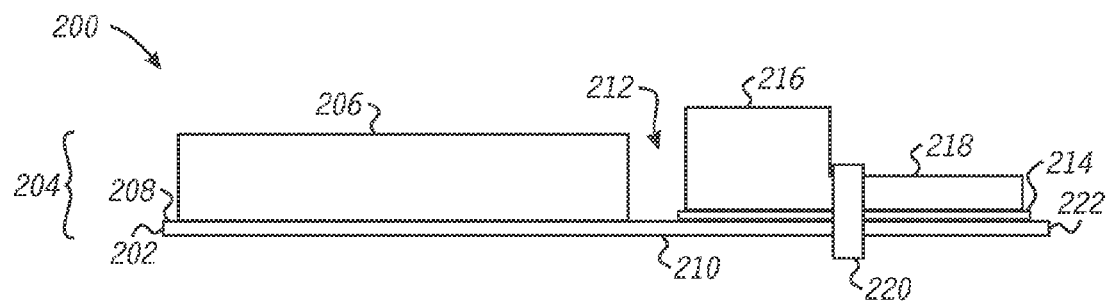
FIG. 2 illustrates a side view of a printed circuit board employing a heat sink apparatus according to one aspect of the disclosure.

FIG. 2 illustrates a side view of a printed circuit board employing a heat sink apparatus according to one aspect of the disclosure. The printed circuit board, illustrated generally at 200, includes a printed circuit board substrate 202 operable to connect electrical components (not illustrated) and in one form, can include a printed circuit board mounting structure 206 operable to secure the printed circuit board 200 to a server rack or other form of an information handling system's mount. The printed circuit board 200 includes an overall height 204, a front surface 208, and a rear surface 210. According to one aspect, a heat sink 212 can be provided as a profiled heat sink, such as a low profile heat sink that can include a body 214, a first thermal element series 216 coupled to the body 214, and a second thermal element series 218 coupled to the body 214. The first thermal element series 216 can include a height that is greater than the second thermal element series 218 ensuring a low profile along a portion of the heat sink 212. For example, a low profile heat sink can be used to ensure additional interfaces, cables, connectors, etc. can be connected, routed, etc. along a portion of the printed circuit board 200 as desired. In one form, the height of the heat sink 212, when coupled to the front surface 208, may not exceed the overall height 204.

According to one aspect, the heat sink 212 can be coupled to the printed circuit board 200 using a retaining mechanism 220 extending from a portion of the second thermal element series 218 along a side portion 222 of the printed circuit board 200. Additionally, a second retaining mechanism (not illustrated) can also be used to couple the heat sink 212 to a second side portion of the printed circuit board (not illustrated). The retaining mechanism 220 can include various types of retaining devices sufficient to provide tension along an upper surface of the heat sink 212 and the rear surface 210 to securely couple the heat sink 212 to the printed circuit board 200. For example, the retaining mechanism 220 can include a tension clip or other tension element operable to securely couple the heat sink 212 to the printed circuit board 200. In this manner, it may not be necessary to use other mounting mechanisms, such as glue, solder, and the like, to mount the heat sink 212 to the printed circuit board 200.

According to one aspect, the printed circuit board 200 can be provided as a communication module that can be coupled to an information handling system. The printed circuit board 200 including a communication module can employ a high-speed communication bus such as a PCI-Express bus. For example, a PCI-Express bus can be operated at approximately can be operated at more than one (1) speed (e.g. 2.5 GHz and 5 GHz) and can be configured to comply with industry standards for connecting and communicating between various PCI-enabled hardware devices. In one form, a PCI-enabled bus can be provided using a PCI specification such as "PCI Local Bus Specification," Version 3.0 dated Feb. 3, 2004 or other PCI specifications as desired. According to another aspect, the printed circuit board 200 can be used within a "1 U" size server that uses tool-less vertical riser cables to connect servers within a server rack. The "1 U" server can include multiple PCI-Express communication modules and in one form, a PCI-Express module located along a central riser can include a PCI expansion hub manufactured by Intel with a part number NQ6702PXHVSLX4 integrated circuit within the printed circuit board 200 and employing the heat sink 212 to provide thermal cooling. The printed circuit board 200 can also be configured to employ various types of integrated circuits and is not limited to communication modules or a specific board type or chip type. As such, the printed circuit board 200 employing the heat sink 212 coupled using the retaining mechanism 220 can be used in association with various types of boards, modules, interface cards, integrated circuits, devices, or any combination thereof, that can benefit from thermal cooling using a heat sink.

Figure 3:
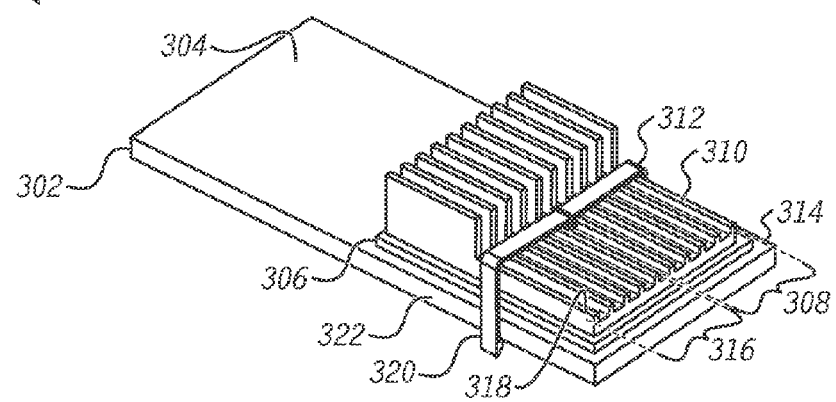
FIG. 3 illustrates a top perspective view of a printed circuit board employing a heat sink coupled using a retaining mechanism according to one aspect of the disclosure.

FIG. 3 illustrates a top perspective view of a printed circuit board, illustrated generally at 300, employing a heat sink coupled using a retaining mechanism according to one aspect of the disclosure. The printed circuit board 300 can include a printed circuit board substrate 302, and a top surface 304. A heat sink 306 can be coupled to the top surface 304. The heat sink 306 can include a first series 308 of thermal elements 310, and a first retaining mechanism 312 extending along the first series 308 and coupled to a first side portion 314 of the printed circuit board 300. The heat sink 306 can also include a second series 316 of thermal elements 318, and a second retaining mechanism 320 extending along the second series 318 and coupled to a second side portion 322 of the printed circuit board 300. The first series 308 of thermal elements 310 can be the same as the second series 316 of thermal elements 318, or in other embodiments, can be different.

Figure 4:
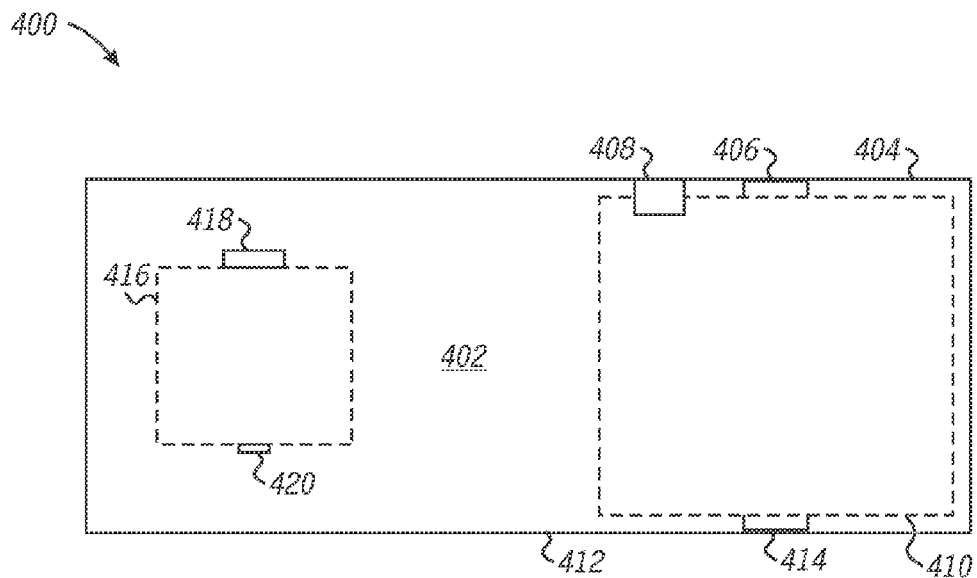
FIG. 4 illustrates a rear view of a printed circuit board incorporating a keyed heat sink apparatus and retaining mechanism according to one aspect of the disclosure.

FIG. 4 illustrates a rear view of a printed circuit board, illustrated generally at 400, operable to employ a keyed heat sink apparatus according to one aspect of the disclosure. The printed circuit board 400 includes rear surface 402, and a first side portion 404 having a first side mounting site 406 sized to receive a retaining mechanism of a heat sink. The printed circuit board 400 can also include a heat sink key 408 located along the first side portion 404 and operable to receive a complimentary key portion of a heat sink (not illustrated) to ensure proper orientation when the heat sink is mounted to the first heat sink mounting region 410. The printed circuit board 400 can also include a second side portion 412 having a second side mounting site 414 sized to receive a second retaining mechanism of a heat sink when mounted to the first heat sink mounting region 410. In one form, the first heat sink mounting region 410, the first side mounting site 406, the second side mounting site 414, or any combination thereof, can include a contact region operable to be used in association with a detection circuit (not illustrated) of the printed circuit board 400. For example, the first side mounting site 406 can include a first contact region and the second side mounting site 414 can include a second side mounting region operably associated with a detection circuit can be used to detect if a heat sink has been properly mounted or is functional. For example, the printed circuit board 400 can be configured to enable a continuity test to detect if a heat sink is mounted. If an open circuit, or some relatively high or expected resistance value is detected, a signal can be provided to a monitoring system operable to communicate operating conditions of the printed circuit board 400.

According to one aspect, the printed circuit board 400 can also include a second heat sink mounting region 416 located along an interior portion of the printed circuit board 400. The second heat sink mounting region 416 can include a first mounting aperture 418 and a second mounting aperture 420. Each aperture can extend through the printed circuit board 400 and can be sized to receive a retaining mechanism operable to couple a heat sink to the printed circuit board 400. In one form, the first mounting aperture 418 can be oversized relative to the second mounting aperture 420. For example, a first retaining mechanism having a first width can be used within the first mounting aperture 418, and a second retaining mechanism having a second width less than the first width can be used within the second mounting aperture 420. In this manner, orientation of a heat sink coupled to the heat sink mounting region 416 can ensured. Various other aperture sizes can also be used as desired. Additionally, the first side mounting site 406, the second side mounting site 414, or any combination thereof can be sized as desired to ensure proper mounting orientation of a heat sink.

Figure 5:
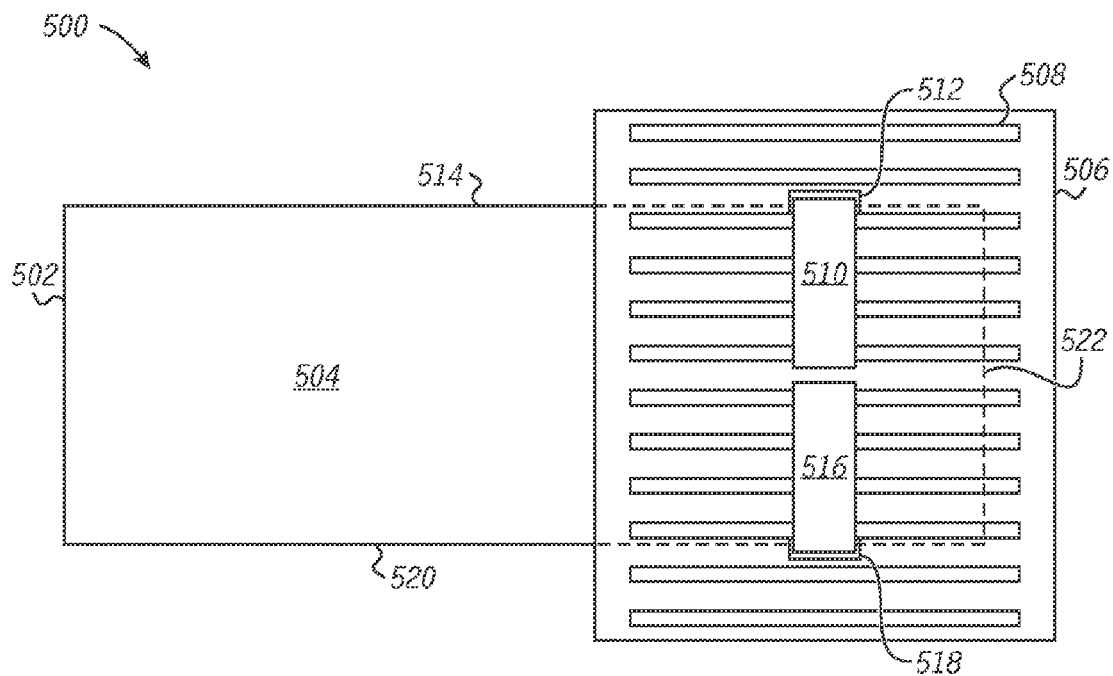
FIG. 5 illustrates a top view of a printed circuit board incorporating a heat sink employing mounting apertures according to one aspect of the disclosure.

FIG. 5 illustrates a top view of a printed circuit board, illustrated generally at 500, incorporating a heat sink employing mounting apertures according to one aspect of the disclosure. The printed circuit board 500 can include a printed circuit bard substrate 502, and a top surface 504. A heat sink 506 can be coupled to the top surface 504. The heat sink 506 can include a plurality of thermal elements 508 and a first retaining mechanism 510 extending along a portion of the thermal elements 508, and through a first heat sink mounting aperture 512 proximally located to a first side portion 514 of the printed circuit board 500. The heat sink 506 can also include a second retaining mechanism 516 extending along a second portion of the thermal elements 508, and through a second heat sink mounting aperture 518. The second heat sink mounting aperture 518 can be mounted proximally to a second side portion 520 of the printed circuit board 500. In one form, the heat sink 506 can extend beyond the printed circuit board 500's first side portion 514, the second side portion 520, the end portion 522, or any combination thereof. Additionally, although illustrated as having a first mounting aperture 512 aligned with the first side portion 514, and the second mounting aperture aligned with the second side portion 520, it should be understood that various other mounting locations, or combinations of mounting locations, can be used. For example, mounting locations can be provided along the end portion 522, along the side portions 514, 520, within an interior portion of the printed circuit board 500, or any combination thereof. In this manner, various sized heat sinks can be provided that extend beyond a portion of the printed circuit board 500 as desired.

Figure 6:
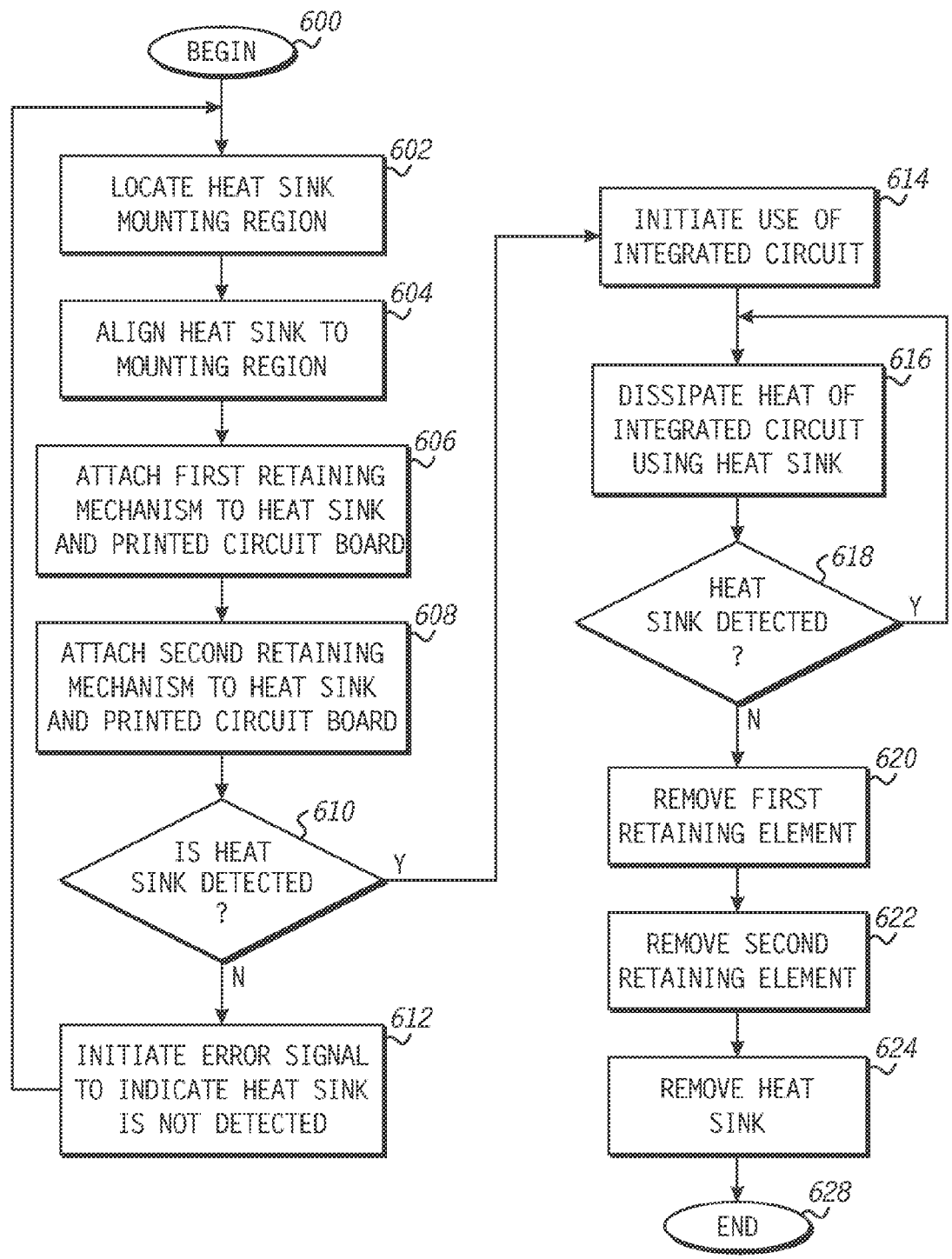
FIG. 6 illustrates a flow diagram of a method of installing and using a heat sink mechanism employing a retaining mechanism according to one aspect of the disclosure.

FIG. 6 illustrates a flow diagram of a method of installing and using a heat sink mechanism employing a retaining mechanism according to one aspect of the disclosure. The method begins generally at block 600. At block 602, a heat sink mounting region can be located on a printed circuit board. The heat sink can be coupled to an integrated circuit to dissipate heat and assist with cooling the integrated circuit during use. Upon locating a heat sink mounting region, the method can proceed to block 604, and the heat sink can be aligned to the heat sink mounting region. For example, a heat sink may be operable to be installed using a specific orientation. As such, the heat sink can include a tab, key, pin, or other alignment device that can be used to align the heat sink to the heat sink mounting region during installation. Other mounting orientation techniques can also be employed as desired.

Upon aligning the heat sink to the heat sink mounting region, the method can proceed to block 606, and a first retaining mechanism can be coupled to the heat sink and the printed circuit board. For example, the first retaining mechanism can include a tension coupling element, such as a tension clip, tension strap, or other form of retaining device operable to produce tension to operable to hold the heat sink to the heat sink mounting region. For example, a tension clip can be clipped to a top surface of the heat sink, extended along a side portion of the printed circuit board, and coupled to a rear surface, or bottom portion, of the printed circuit board. Upon coupling the first retaining mechanism, the method can proceed to block 608 and a second retaining mechanism can be attached to the heat sink and the printed circuit board along a second side portion of the printed circuit board. In other forms, the first retaining mechanism, the second retaining mechanism, or any combination thereof, can be coupled using an aperture operable to couple the retaining mechanism to the heat sink and the printed circuit board.

Upon coupling the second retaining mechanism, the heat sink can be monitored to determine if the heat sink is installed. In one form, the method can proceed to decision block 610, and determine if the heat sink is detected. If the heat sink is not detected, the method can proceed to block 612, and an error signal can be communicated to indicate that the heat sink has not been detected or properly mounted. The method can then proceed to block 602 and repeat as desired. If at decision block 610, the heat sink is detected (e.g. properly installed, functional), the method can proceed to block 614 and the integrated circuit can be used. The method can then proceed to block 616 and the heat sink can dissipate heat generated by the integrated circuit. The method can then proceed to decision block 618, and if the heat sink is still detected (e.g. not defective or installation not compromised), the method can proceed to block 616 and repeat. If at decision block 618, the heat sink is not detected, becomes defective, or needs replacing, the method can proceed to block 620, and the first retaining mechanism can be removed. The method can then proceed to block 622 and the second retaining mechanism can be removed. Upon removing the retaining mechanisms, the method can proceed to block 624 and the heat sink can be removed. The method can then proceed to block 628 where the method ends.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A heat sink apparatus comprising:
  a heat sink operable to be coupled to a first portion of a printed circuit board, the heat sink comprising:
    a first plurality of thermal elements having a first height; and
    a second plurality of thermal elements having a second height that is less than the first height, wherein the second plurality of thermal elements extend from the heat sink in a substantially same direction as the first plurality of thermal elements; and
  a retaining mechanism operably coupled along a first surface of the heat sink, the retaining mechanism operable to be coupled to a second portion of the printed circuit board to produce a tension between the first surface of the heat sink and the second portion of the printed circuit board, and wherein the retaining mechanism comprises:
    a first tension coupling element operable to be coupled to a first portion of the first surface of the heat sink, the first tension coupling element configured to extend from the first surface of the heat sink to along a first side portion of the printed circuit board, the first side portion including a first electrical contact region operable to be used in association with a detection module to monitor the coupling of the retaining mechanism to the second portion of the printed circuit board, and wherein the first tension coupling element extends over a first portion of the second plurality of thermal elements; and
    a second tension coupling element operable to be coupled to a second portion of the first surface of the heat sink, the second tension coupling element configured to extend from the first surface of the heat sink to along a second side portion of the printed circuit board, the second side portion including a second electrical contact region operable to be used in association with a detection module to monitor the coupling of the retaining mechanism to the second portion of the printed circuit board, and wherein the second tension coupling element extends over a second portion of the second plurality of thermal elements.

2. The heat sink apparatus of claim 1, wherein the first tension coupling element comprises a size different from the second tension coupling element.

3. The heat sink apparatus of claim 1, wherein the printed circuit board includes at least one aperture extending through the printed circuit board and sized to receive the first tension coupling element.

4. The heat sink apparatus of claim 1, wherein the heat sink further comprises at least one aperture operable to receive the retaining mechanism and access a portion of the printed circuit board to mount the heat sink using the tension.

5. The heat sink apparatus of claim 4, wherein the printed circuit board comprises a PCI Express enabled communication module.

6. An information handling system comprising:
  a printed circuit board;
  a heat sink coupled to a first portion of the printed circuit board, the heat sink including:
    a first plurality of thermal elements having a first height; and
    a second plurality of thermal elements having a second height that is less than the first height, wherein the second plurality of thermal elements extend from the heat sink in a substantially same direction as the first plurality of thermal elements; and
  a retaining mechanism coupled along a first surface of the heat sink, and coupled to a second portion of the printed circuit board to produce a tension between the first surface of the heat sink and the second portion of the printed circuit board, the retaining mechanism comprising:
    a first tension coupling element operable to be coupled to a first portion of a first surface of the heat sink, wherein:
      the first tension coupling element is configured to extend from the first surface of the heat sink to along a first external side portion of the printed circuit board; and
      the first tension coupling element extends over a first portion of the second plurality of thermal elements; and a second tension coupling element operable to be coupled to a second portion of the first surface of the heat sink, wherein:
   the second tension coupling element is configured to extend from the first surface of the heat sink to along a second external side portion of the printed circuit board; and
   the second tension coupling element extends over a second portion of the second plurality of thermal elements.

7. The information handling system of claim 6, wherein the heat sink comprises a profiled heat sink including an alignment key.

8. The information handling system of claim 6, further comprising:
   a PCI Express riser cable coupled to the printed circuit board operable as a communication module.

* * * * *